(12) United States Patent
Choi (10) Patent No.: US 7,839,654 B2
(45) Date of Patent: Nov. 23, 2010

(54) METHOD FOR ULTIMATE NOISE ISOLATION IN HIGH-SPEED DIGITAL SYSTEMS ON PACKAGES AND PRINTED CIRCUIT BOARDS (PCBS)

(75) Inventor: Jinwoo Choi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 878 days.

(21) Appl. No.: 11/679,951

(22) Filed: Feb. 28, 2007

(65) Prior Publication Data

US 2008/0204127 A1    Aug. 28, 2008

(51) Int. Cl.
H05K 1/11 (2006.01)
(52) U.S. Cl. .................. 361/792; 361/782; 361/818
(58) Field of Classification Search ............ 361/792, 361/782, 818
See application file for complete search history.

(56) References Cited

U.S. PATENT DOCUMENTS

| | | | |
|---|---|---|---|
| 5,068,631 A | | 11/1991 | Vince |
| 6,396,137 B1 * | | 5/2002 | Klughart ............... 257/691 |
| 2003/0184980 A1 | | 10/2003 | Tanaka et al. |
| 2005/0104678 A1 | | 5/2005 | Shahparnia et al. |
| 2006/0050010 A1 | | 3/2006 | Choi et al. |
| 2006/0092093 A1 | | 5/2006 | Choi et al. |
| 2007/0001926 A1 | | 1/2007 | Waltho |
| 2009/0135570 A1 * | | 5/2009 | Chou et al. ............ 361/782 |

OTHER PUBLICATIONS

Choi et al., "A Novel Electromagnetic Bandgap (EBG) Structure for Mixed-Signal System Application", IEEE, 2004, Georgia Institute of Technology, 2 pages.

* cited by examiner

Primary Examiner—Jinhee J Lee
Assistant Examiner—Andargie M Aychillhum
(74) Attorney, Agent, or Firm—Yee & Associates, P.C.; Matthew W. Baca (57) ABSTRACT

Improved noise isolation for high-speed digital systems on packages and printed circuit boards is provided by the use of mixed alternating impedance electromagnetic bandgap (AI-EBG) structures and a power island configured to provide ultimate noise isolation. A power island is surrounded by a plurality of mixed AI-EBG structures to provide a power distribution network. In this structure, the gap around the power island provides excellent isolation from DC to the first cavity resonant frequency which is determined by the size of the structure and dielectric material. One AI-EBG structure provides excellent isolation from the first cavity resonant frequency of around 1.5 GHz to 5 GHz. The other AI-EBG structure provides excellent noise isolation from 5 GHz to 10 GHz. Through use of this novel configuration of AI-EBG structures, a combination effect of the hybrid AI-EBG structure provides excellent isolation far in excess of 10 GHz. The AI-EBG structure is a metallic-dielectric EBG structure that comprises two metal layers separated by a thin dielectric material (similar to power/ground planes in packages and PCBs). However, in the AI-EBG structure, only one of the metal layers has a periodic pattern which is preferably a two-dimensional rectangular lattice with each element consisting of a metal patch with four connecting metal branches.

3 Claims, 9 Drawing Sheets

METHOD FOR ULTIMATE NOISE ISOLATION IN HIGH-SPEED DIGITAL SYSTEMS ON PACKAGES AND PRINTED CIRCUIT BOARDS (PCBS)

RELATED APPLICATION

This application is related to co-pending U.S. patent application entitled "Mixed-signal systems with alternating impedance electromagnetic bandgap (ai-ebg) structures for noise suppression/isolation" having Ser. No. 11/260,952, filed on Oct. 28, 2005, and which is entirely incorporated herein by reference as background material.

BACKGROUND

1. Field of the Invention

The present disclosure is generally related to a noise isolation technique useful in high-speed digital systems on packages and printed circuit boards (PCBs), collectively referred to herein as a component carrier, and more particularly is related to electromagnetic bandgap structures that provide ultimate noise isolation (i.e., from DC to a substantially infinite frequency).

2. Description of the Related Art

Over the last decade, the scaling of the CMOS transistors has enabled the design of microprocessors operating at multi-gigahertz frequencies. This trend, based on the International Technology Roadmap for Semiconductors (ITRS), is expected to continue over many years for both desktop and mobile computers. Along with the scaling of the transistor, the number of transistors on a chip is doubling every 18 months, based on Moore's law. In addition, long-haul communication bandwidth is estimated to be doubling every nine months, much faster than Moore's law. A combination of voltage scaling and Moore's law is causing an alarming increase in the power consumed by microprocessors. Since computers are broadband systems, the current needs to be supplied to the switching circuits over a broad frequency range from DC to at least the second harmonic of the clock frequency. This trend in microprocessors is causing a major challenge for distributing power in computer systems. With voltage scaling and wireless integration in mobile computers, the tolerance to power supply noise is rapidly decreasing.

A major contribution to power supply noise comes from the package and board level interconnections. Because of their distributed electrical characteristics, package and board interconnections can support electromagnetic waves in the power distribution network (PDN). One of the most important areas in high-speed digital systems is the design and analysis of the PDN. The power distribution network supplies power to core logic and I/O circuits in any digital systems. As clock speeds increase, and signal rise time and supply voltages decrease, the transient currents injected into the power distribution planes can induce voltage fluctuation on the power distribution network. This undesired voltage fluctuation on the power/ground planes is commonly known as simultaneous switching noise (SSN), power supply noise, and delta-I noise. Power supply noise leads to unwanted effects on PDN such as ground bounce, false triggering in digital circuits, and waveform distortion in the time domain. It has been shown (in references [1]-[3] identified below) that power supply noise induced by a large number of simultaneously switching circuits in a printed circuit board (PCB) or multichip module (MCM) can limit the performance of the system ([1] R. R. Tummala, E. J. Rymaszwski, and A. G. Klopfenstein, Microelectronics Packaging Handbook, 2nd ed., New York: Chapman & Hall, 1997, pt. I; [2] R. R. Tummala, Fundamentals of Microsystems Packaging, McGraw-Hill, 2001; [3] S. Hall, G. Hall, and J. A. McCall, High-Speed Digital System Design, John Wiley & Sons, Inc., 2000). Especially, power supply noise can be transferred to anywhere in power/ground planes in packages and boards since power/ground planes behave as a parallel-plate waveguide at high frequencies.

Power/ground planes in packages and PCBs represent large metal layers separated by a small dielectric distance. Due to the small dielectric distance, power/ground planes in the package and PCB are capacitive at low frequencies and are therefore ideal for supplying power to the integrated circuits. However, with increase in frequency, planes become inductive and resonate at discrete frequencies. Conventional power and ground planes have a dielectric thickness of less than 100 mils and the dielectric thickness becoming thinner with advances in technology. The lowest transverse magnetic (TM) and transverse electric (TE) modes for the parallel-plate waveguide have cut-off frequencies in the order of hundreds of gigahertz, which implies TM and TE modes of the parallel-plate waveguide are not a major concern for the systems operating at 10 GHz and below. Therefore, the only modes of concerns are the transverse electromagnetic (TEM) modes of the parallel-plate waveguide and cavity resonator modes due to the finite size of the power/ground planes. For these modes for the parallel-plate waveguide, it was assumed that the conducting planes have infinite length in the x and z directions. However, real power and ground planes have the finite size of the width and length, which means that waves propagating to the edges of the power/ground planes have to be reflected back and forth. The rectangular cavity resonator modes occur at the following frequencies $$f_{cavity} = \frac{1}{2\pi\sqrt{\mu\varepsilon}}\sqrt{\left(\frac{m\pi}{a}\right)^2 + \left(\frac{n\pi}{b}\right)^2 + \left(\frac{p\pi}{d}\right)^2} \quad (1)$$

where μ is the permeability of a dielectric material, ∈ is the permittivity of a dielectric material, and m, n, and p are mode numbers equal to 0, 1, 2, . . . , but except m=n=p=0 and a is the width of the power/ground planes, b is the length of the power/ground planes, d is the dielectric thickness of a dielectric layer in the power/ground planes. But, in practical power/ground planes, a dielectric thickness d is much smaller than both the width (a) and the length (b), which means the standing wave patterns along dimension d will be at frequencies that are tens to hundreds of times higher than the resonant frequencies of waves along the width and length of power/ground planes. Hence, the cavity resonant frequencies in equation (1) for practical power/ground planes can be written as:

$$f_{cavity} = \frac{1}{2\pi\sqrt{\mu\varepsilon}}\sqrt{\left(\frac{m\pi}{a}\right)^2 + \left(\frac{n\pi}{b}\right)^2} \quad (2)$$

One typical approach to isolate digital circuits from other digital circuits on packages and printed circuit boards is to split the power plane for both power and ground planes. The gap in power plane or ground plane can partially block the propagation of electromagnetic waves. For this reason, split planes are usually used to isolate digital circuits from other digital circuits. Although split planes can block the propagation of electromagnetic waves, part of the electromagnetic energy can still couple through the gap. Hence, this method only provides a marginal isolation (−20 dB~−60 dB) at high frequencies (usually above ~1 GHz) and could create a serious problem as the sensitivity of digital circuits increases and the operating frequency of the system increases. Generally, split planes provide good isolation (−70 dB~−80 dB) at low frequencies (usually below ~1 GHz) but show poor isolation (−20 dB~−60 dB) at high frequencies because of electromagnetic coupling. Especially, noise at resonance peaks can be transferred easily from one place to the other in split planes since the isolation level at these resonance peaks is around −20 dB.

Electromagnetic bandgap (EBG) structures have become popular because of their ability for suppressing unwanted electromagnetic mode transmission and radiation in microwave and millimeter waves. The EBG structures are periodic structures in which the propagation of electromagnetic waves is forbidden in certain frequency bands. In these EBG structures, the constructive and destructive interference of electromagnetic waves results in transmission and reflection bands. A common feature of periodic structures is the existence of frequency bands where electromagnetic waves are highly attenuating and do not propagate. Among these EBG structures, alternating impedance electromagnetic bandgap (AI-EBG) structure was developed for noise isolation in mixed-signal systems in 2004 and showed excellent isolation (−80 dB~−140 dB), which is the best isolation reported. However, this type of AI-EBG structure only provides excellent isolation in high frequency range but does not provide excellent isolation in DC and low and mid frequency ranges. In high-speed digital systems, good noise isolation is required from DC to at least the second harmonic frequency of the clock frequency. These days the clock frequency of the high-speed digital systems is going up, and will continue to increase in the future.

Therefore, the development of a better noise isolation method is needed for good performance of a high-speed digital system on packages and printed circuit boards (PCBs). It would thus be desirable to provide an improved noise isolation structure with improved operating characteristics while maintaining ease of manufacturability.

SUMMARY

Improved noise isolation for high-speed digital systems on packages and printed circuit boards (PCBs) is provided by the use of power island and mixed (or hybrid) alternating impedance electromagnetic bandgap (AI-EBG) structures configured to provide ultimate noise isolation (i.e., from DC to a substantially infinite frequency). A power island is surrounded by a plurality of mixed AI-EBG structures to provide a power distribution network. In this structure, the gap around the power island provides excellent isolation from DC to the first cavity resonant frequency. One AI-EBG structure (type I) provides excellent isolation from the first cavity resonant frequency of around 1.5 GHz to about 5 GHz. The other AI-EBG structure (type II) provides excellent isolation from about 5 GHz to 10 GHz. Through use of this novel configuration with mixed AI-EBG structures and a power island, a combination effect of the hybrid AI-EBG structure (i.e., the unique combination of type I and type II structures) provides excellent isolation far in excess of 10 GHz. The AI-EBG structure is a metallic-dielectric EBG structure that comprises two metal layers separated by a thin dielectric material (similar to power/ground planes in packages and PCBs). However, in the AI-EBG structure, only one of these metal layers has a periodic pattern which is a two-dimensional (2-D) rectangular lattice with each element consisting of a metal patch with four connecting metal branches.

Other structures, systems, methods, features, and advantages of the present disclosure will be apparent to one with skill in the art upon examination of the following drawings and detailed description, and are intended to be within the scope of the present disclosure and accompanying claims.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Figure 1:
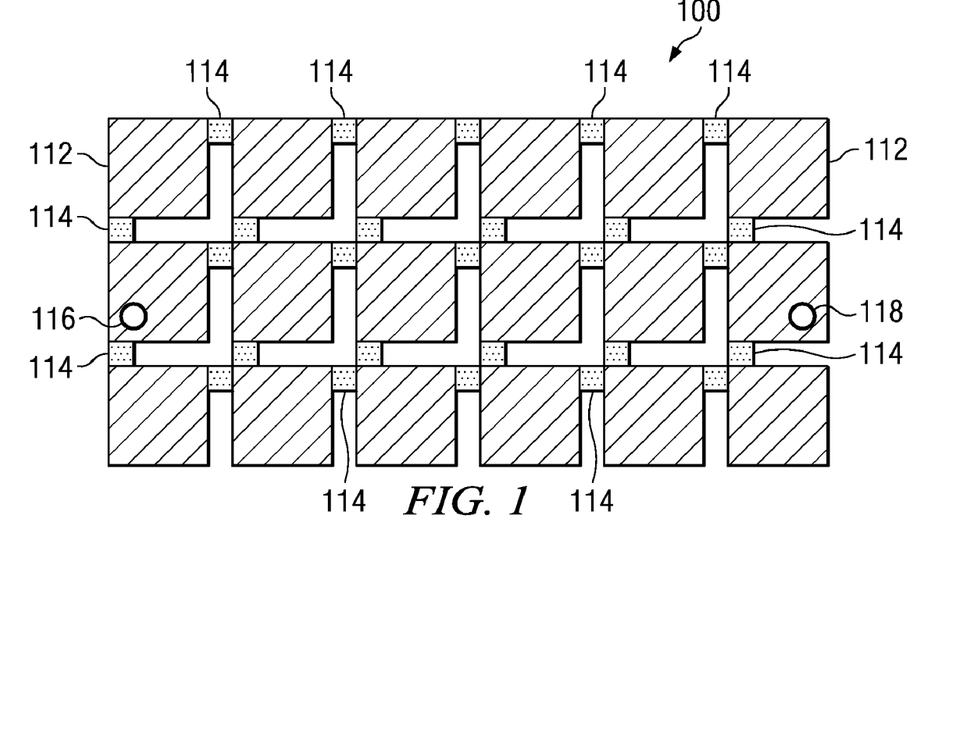
FIG. 1 illustrates a top view of one embodiment of a system having an AI-EBG structure.

Referring now to the figures and in particular to FIG. 1, there is shown one type of AI-EBG structure that provides noise isolation for a wide frequency range in high frequency. FIG. 1 illustrates a top view of one embodiment of a system having an AI-EBG structure 100. The AI-EBG structure 100 has an AI-EBG plane that includes a plurality of first elements 112 continuously connected by a plurality of second elements 114 in the same dimensional plane (not all of the first and second elements are labeled in FIG. 1, in order to not obscure details of the figure). The first elements 112 have relatively low characteristic impedance and the second elements 114 have relatively high characteristic impedance to thus provide a multiple alternating impedance electromagnetic bandgap (AI-EBG) structure. At first location 116 and second location 118, the AI-EBG plane can also be coupled to supply power/ground to various devices or circuits. At first location 116, the AI-EBG plane can be coupled to a port, a digital circuit or an RF/analog circuit. At second location 118, the AI-EBG plane can also be coupled to a port, a digital circuit or an RF/analog circuit. For example, a digital circuit can be coupled to first location 116, while an RF/analog circuit can be coupled to second location 118.

The first elements 112 and the second elements 114 can be various shapes. As illustrated, both the first elements 112 and second elements 114 have rectangular shapes, and thus the AI-EBG plane is easy to design, fabricate, and analyze. However, the first elements 112 and the second elements 114 can also be other types of structures that produce sections of low and high characteristic impedance. In particular, the first elements 112 and the second elements 114 can each independently be a square, polygonal, hexagonal, triangular, or circular shape, or combinations thereof.

A given second element 114 is attached to various of the first elements 112 at various positions. In FIG. 1, the second elements 114 are each attached to the corners of the square first elements 112. The second elements 114 can be attached at other positions on the perimeter of the first elements 112. However, attachment on the edges of the first elements 112 provides the best isolation.

Figure 2:
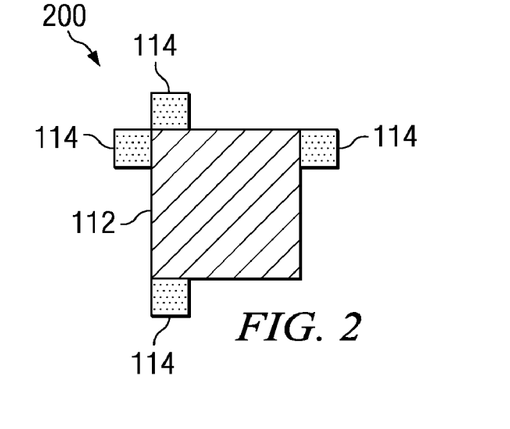
FIG. 2 illustrates a top view of a unit cell in one of power/ground planes in the AI-EBG structure.

FIG. 2 illustrates a top view of a single, unit cell 200 of the AI-EBG structure 100 depicted in FIG. 1, showing in detail first elements 112 and second elements 114.

Figure 3:
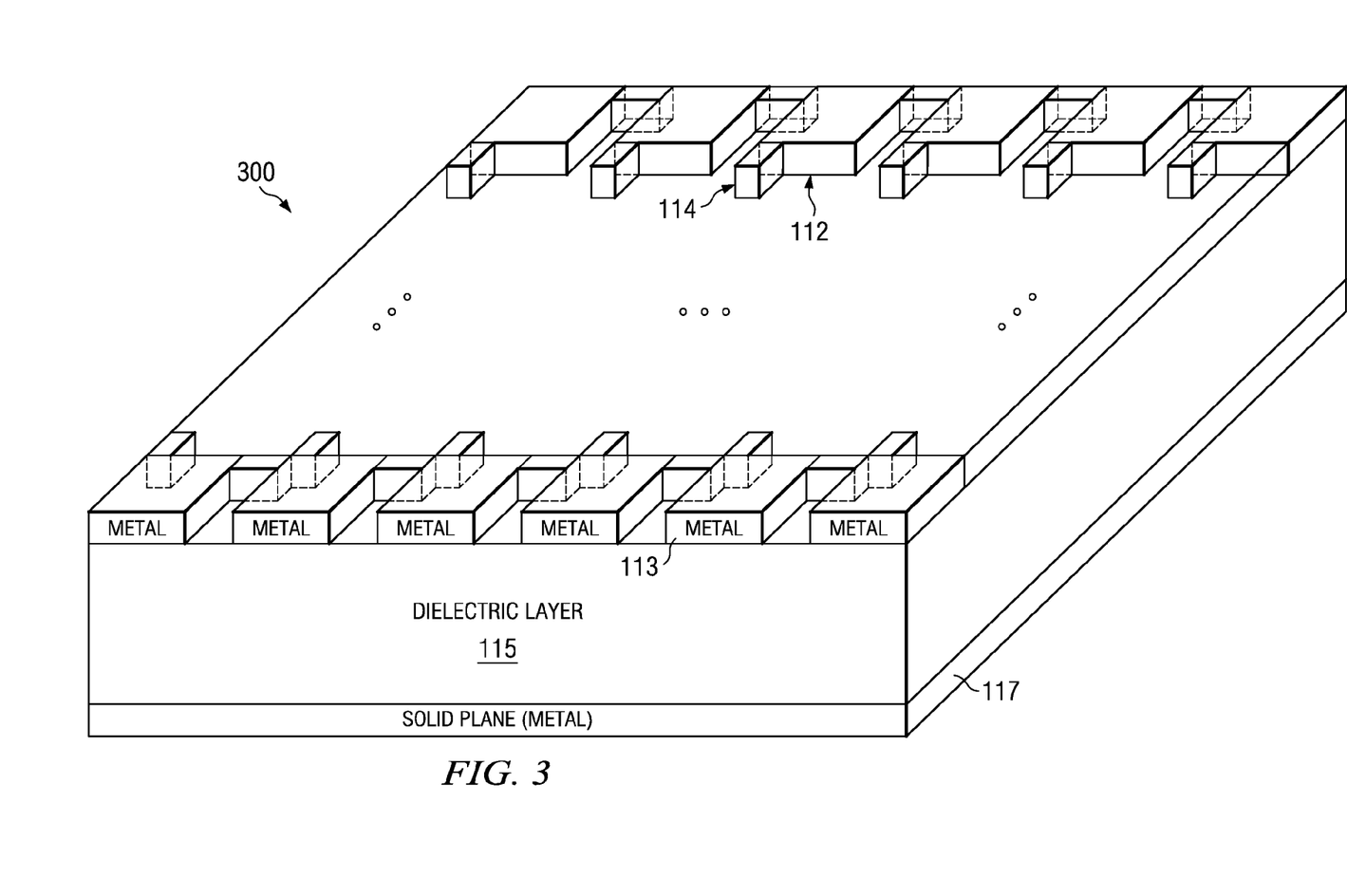
FIG. 3 illustrates a three-dimensional elevated, side view of the system having an AI-EBG structure.

FIG. 3 illustrates a three-dimensional view of the system 300 having AI-EBG structure 100. This system having the AI-EBG structure 100 includes an AI-EBG plane 113, a dielectric layer 115, and a solid metal plane 117. The AI-EBG plane 113 can be included in a ground plane or a power plane depending on a design purpose. For example, the AI-EBG plane 113 can be a power plane etched with first elements 112 and second elements 114 (as also shown in FIG. 1), while the solid metal plane 117 can be a continuous (or solid) metal layer acting as a ground plane.

The AI-EBG plane 113 can be fabricated using copper, palladium, aluminum, platinum, chromium, or combinations thereof. The AI-EBG plane 113 preferably has a thickness between about 0.1 mil and 100 mils.

The dielectric layer 115 is made from a dielectric material with a dielectric constant having a relative permittivity of about 2.2 to about 16, and/or a dielectric loss tangent of about 0.001 to about 0.3, and combinations thereof. In one embodiment, the dielectric layer 115 is made from FR4, which is generally used as an insulating base material for PCBs. "FR4" stands for "Flame Retardant 4". FR4 is also sometimes referred to as fiberglass boards or substrates. It should be noted that dielectric layer in the AI-EBG structure can be any organic or ceramic material depending on the application. The dielectric layer 115 preferably has a thickness between about 1 mil and about 100 mils.

The solid metal plane 117 can be a ground plane or a power plane. The solid metal plane 117 can be fabricated using copper, palladium, aluminum, platinum, chromium, or combinations thereof. The solid metal plane 117 preferably has a thickness between about 1 mil and about 10 mils.

In general, the length and width of the AI-EBG structure 100 can vary depending on the application. The AI-EBG structure 100 can be fabricated to a length and a width to accommodate particular types of electronics systems. For compact electronic applications, the AI-EBG structure can be very small (i.e., less than 1 cm×1 cm) since the size of the first and second elements can be reduced pretty much if a high k dielectric material (i.e., a dielectric material with a high dielectric constant) is used as a dielectric material. For PCB applications, the AI-EBG structure can be as large as the dimension of the PCB (for example, 40 cm×40 cm).

Figure 4:
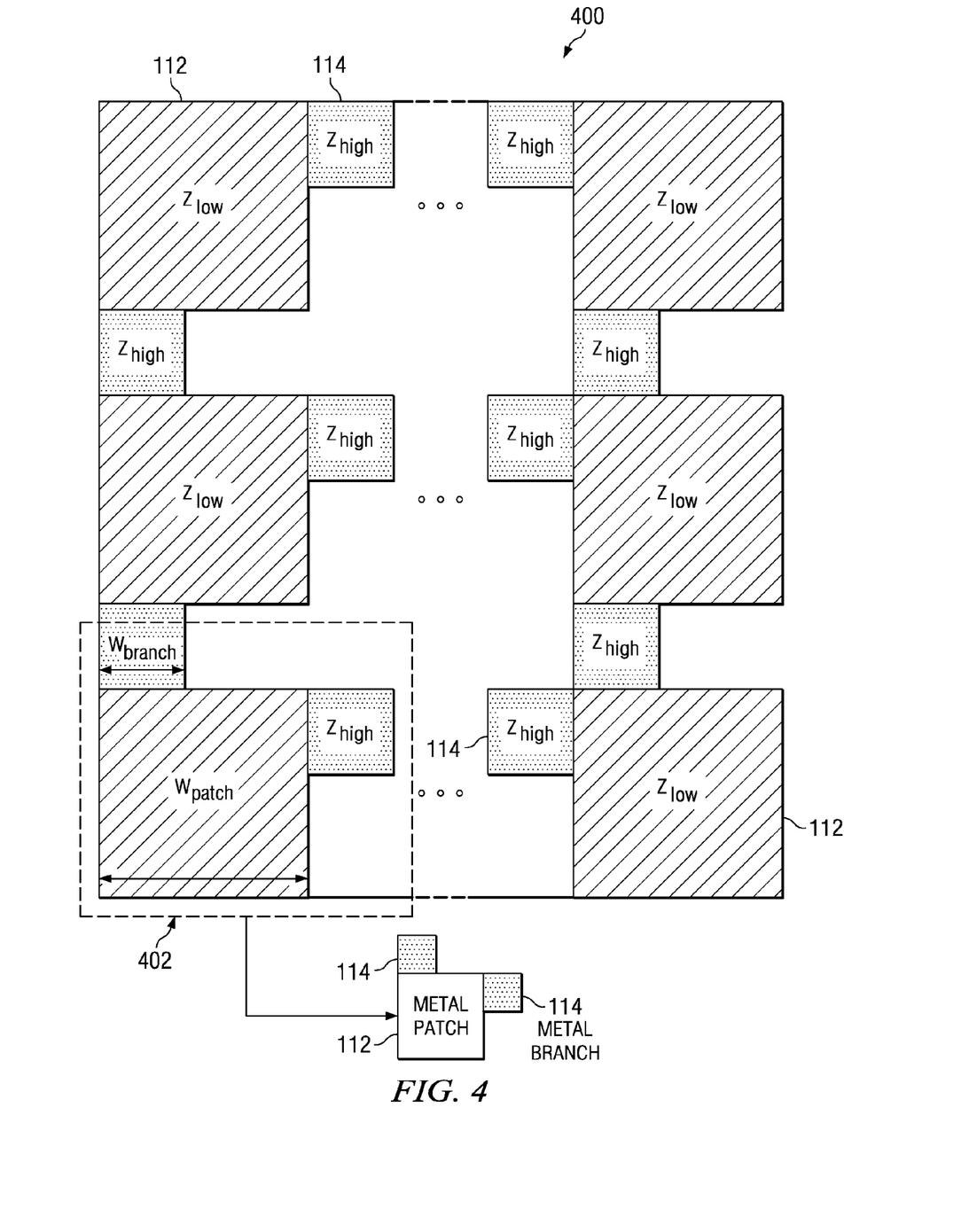
FIG. 4 illustrates an electromagnetic bandgap structure having alternating impedance.

FIG. 4 illustrates at 400 an electromagnetic bandgap structure having alternating impedance. This is an impedance representation of the structure 100 depicted in FIG. 1. The AI-EBG structure 400 has an AI-EBG plane that includes a plurality of metal patch elements 112 continuously connected by a plurality of metal branch elements 114 in the same dimensional plane (not all of the first and second elements are labeled in FIG. 4, in order to not obscure details of the figure). The metal patch elements 112 have relatively low characteristic impedance and the metal branch elements have relatively high characteristic impedance to thus provide a multiple alternating impedance electromagnetic bandgap (AI-EBG) structure. Also depicted in FIG. 4 is the associated widths $W_{patch}$ and $W_{branch}$ for the respective metal patch and metal branch elements. Also shown is an enlargement of a given metal patch and its associated branches which is located at the lower left corner of structure 400.

Figure 5:
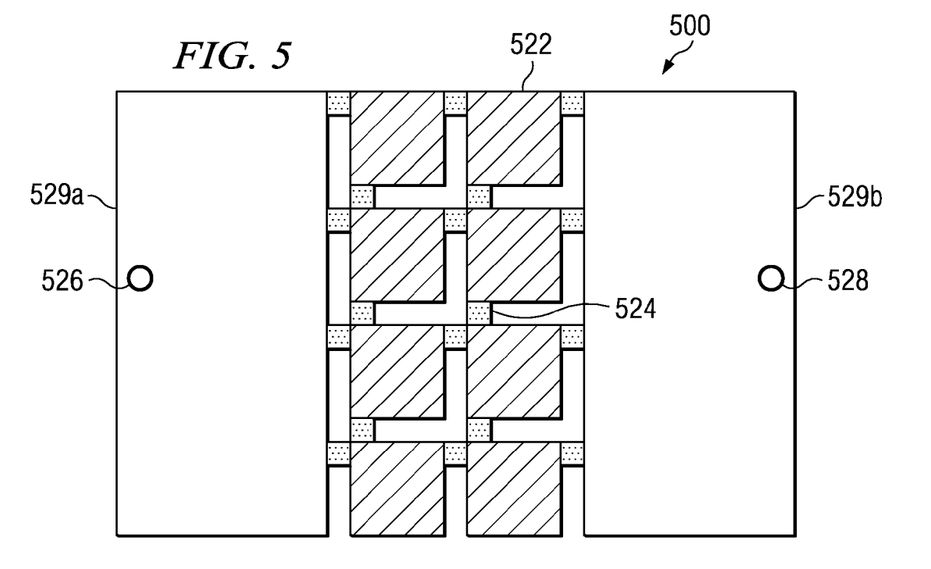
FIG. 5 illustrates a top view of a system having a partial AI-EBG structure.

FIG. 5 illustrates another embodiment of a system having an AI-EBG structure. The AI-EBG structure 500 includes a plurality of first elements 522 continuously connected by a plurality of second elements 524. The plane elements 529a and 529b are a part of a continuous metal layer. This system having the AI-EBG structure 500 can also include various devices or circuits coupled at first location 526 and second location 528. For example, first location 526 can be coupled to a port, a RF/analog circuit or a digital circuit as a power or ground source. Similarly, second location 528 can be coupled to a port, a RF/analog circuit, or a digital circuit as a power or ground source. For example, a digital circuit can be coupled to first location 526, while an RF/analog circuit can be coupled to second location 528.

Figure 6:
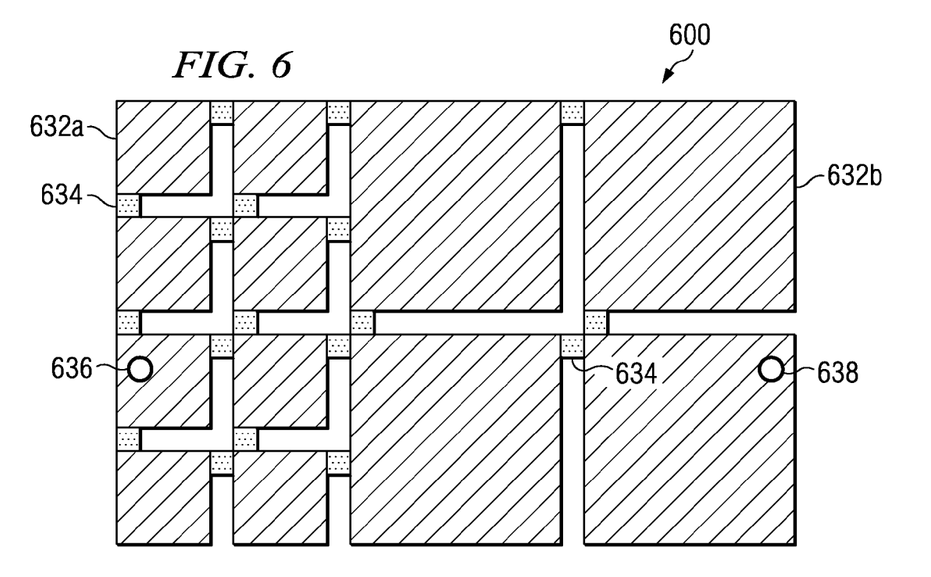
FIG. 6 illustrates a top view of another type of system having a hybrid (or mixed) AI-EBG structure.

FIG. 6 illustrates another embodiment of a system having an AI-EBG structure. The AI-EBG structure 600 includes a plurality of first elements 632a and 632b continuously connected by a plurality of second elements 634. The first elements 632a are smaller in size than the larger first elements 632b. This system having the AI-EBG structure 600 can also include various devices or circuits at first location 636 and second location 638, in similar fashion to that described above with respect to the first and second locations 526 and 528 of FIG. 5.

This AI-EBG structure 600 can achieve very wide, high frequency bandgap (e.g., −40 dB bandgap ranging between 500 MHz and 10 GHz). For example, the larger first elements 632b and the second elements 634 can produce a bandgap from about 500 MHz to 3 GHz (−40 dB bandgap), while smaller first elements 632a and the second elements 634 produce a bandgap from about 3 GHz to 10 GHz (−40 dB bandgap). Thus, an AI-EBG structure can produce an ultra wide bandgap, albeit at relatively high frequencies. The ratio between the first elements and the second elements is preferably, but not limited to, about 4 to 300.

Figure 7:
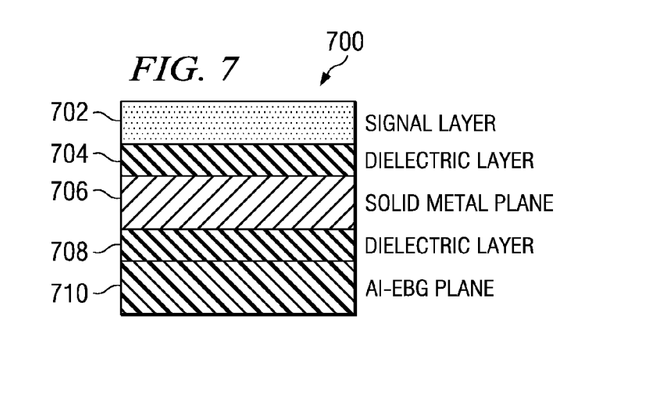
FIG. 7 illustrates a cross-section view of an embodiment of layer stack-up in packages and printed circuit boards (PCBs) including alternating impedance electromagnetic bandgap (AI-EBG) planes to avoid signal integrity problem.
Figure 8:
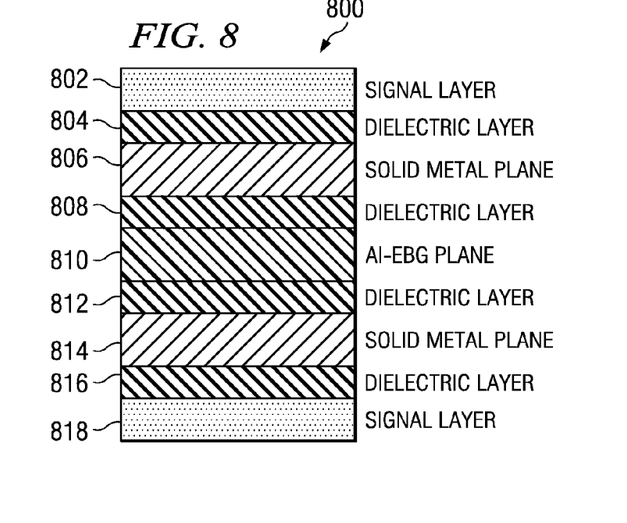
FIG. 8 illustrates another cross-section view of an embodiment of layer stack-up in packages and PCBs including alternating impedance electromagnetic bandgap (AI-EBG) planes to avoid signal integrity problem.
Figure 9:
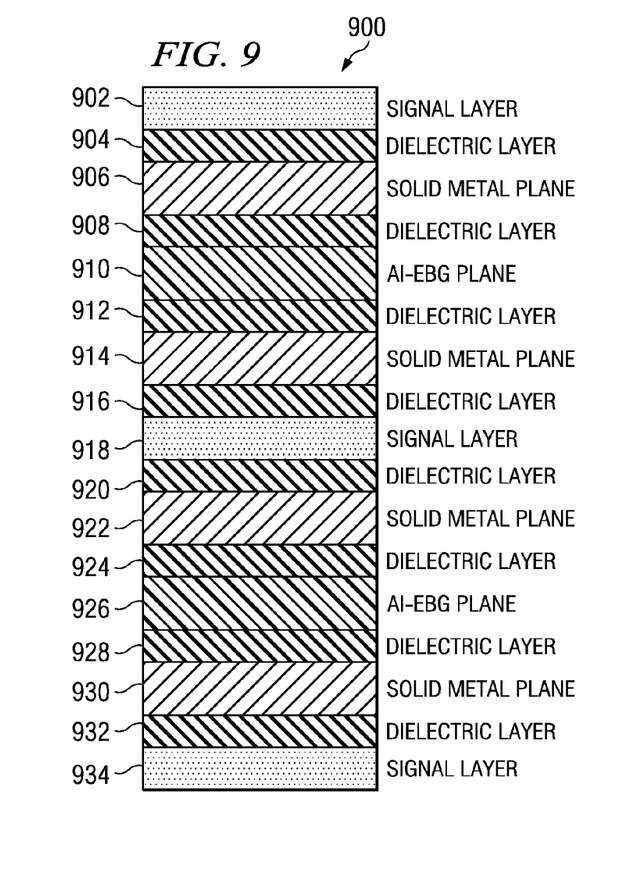
FIG. 9 illustrates yet another cross-section view of an embodiment of layer stack-up in packages and PCBs including alternating impedance electromagnetic bandgap (AI-EBG) planes to avoid signal integrity problem.

FIGS. 7-9 illustrate various embodiments of the AI-EBG structure having different stack configurations. This layer stack-up is necessary to avoid a signal integrity issue. FIG. 7 illustrates a structure 700 including a signal layer 702, a dielectric layer 704, a solid metal plane 706, a dielectric layer 708 and an AI-EBG plane 710.

The signal layer 702 is positioned on the top of the dielectric layer 704. The solid metal plane 706 is positioned on the bottom (back side) of the dielectric layer 704. The dielectric layer 708 is positioned on the bottom of the solid metal plane 706. The AI-EBG plane 710 is positioned on the bottom of the dielectric layer 708. Each layer or plane can be a ground plane or a power plane, and the selection of the type of layer or plane can be determined based on the product that the AI-EBG structure is incorporated into and the desired characteristics of the AI-EBG structure.

The dielectric layer, the solid metal plane, and the AI-EBG plane have already been described in detail above. The signal layer 702 is a partial metal layer that can be fabricated from copper, palladium, aluminum, platinum, chromium, or combinations thereof. The signal layer 702 includes transmission lines, which send signals from one place to another place within the electronic device/system. By using the solid metal plane as the reference plane for the signal layer in high-speed digital systems, the stacking of structure 700 substantially mitigates signal integrity and EMI problems, while the AI-EBG structure provides excellent noise isolation.

FIG. 8 illustrates structure 800 having multiple signal layers, and includes a first signal layer 802, a dielectric layer 804, a solid metal plane 806, a dielectric layer 808, an AI-EBG plane 810, a dielectric layer 812, a solid metal plane 814, a dielectric layer 816, and a second signal layer 818. The dielectric layer, the solid metal plane, the AI-EBG plane, and the signal layer have already been described in detail above.

The first signal layer 802 is positioned on the top of the dielectric layer 804. The solid metal plane 806 is positioned on the bottom of the dielectric layer 804. The dielectric layer 808 is positioned on the bottom of the solid metal plane 806. The AI-EBG plane 810 is positioned on the bottom of the dielectric layer 808. The dielectric layer 812 is positioned on the bottom of the AI-EBG plane 810. The solid metal plane 814 is positioned on the bottom of the dielectric layer 812. The dielectric layer 816 is positioned on the bottom of the solid metal plane 814. The second signal layer 818 is positioned on the bottom of the dielectric layer 816. Each layer or plane can be a ground plane or a power plane, and the selection of the type of layer or plane can be determined based on the product that the AI-EBG structure is incorporated into and the desired characteristics of the AI-EBG structure.

FIG. 9 illustrates structure 900 having multiple signal layers, and includes a first signal layer 902, a dielectric layer 904, a solid metal plane 906, a dielectric layer 908, an AI-EBG plane 910, a dielectric layer 912, a solid metal plane 914, a dielectric layer 916, a second signal layer 918, a dielectric layer 920, a solid metal plane 922, a dielectric layer 924, an AI-EBG plane 926, a dielectric layer 928, a solid metal plane 930, a dielectric layer 932, and a third signal layer 934. The dielectric layer, the solid metal plane, the AI-EBG plane, and the signal layer have already been described in detail above.

The first signal layer 902 is positioned on the top of the dielectric layer 904. The solid metal plane 906 is positioned on the bottom of the dielectric layer 904. The dielectric layer 908 is positioned on the bottom of the solid metal plane 906. The AI-EBG plane 910 is positioned on the bottom of the dielectric layer 908. The dielectric layer 912 is positioned on the bottom of the AI-EBG plane 910. The solid metal plane 914 is positioned on the bottom of the dielectric layer 912. The dielectric layer 916 is positioned on the bottom of the solid metal plane 914. The second signal layer 918 is positioned on the bottom of the dielectric layer 916. The dielectric layer 920 is positioned on the bottom of the signal layer 918. The solid metal plane 922 is positioned on the bottom of the dielectric layer 920. The dielectric layer 924 is positioned on the bottom of the solid metal plane 922. The AI-EBG plane 926 is positioned on the bottom of the dielectric layer 924. The dielectric layer 928 is positioned on the bottom of the AI-EBG plane 926. The solid metal plane 930 is positioned on the bottom of the dielectric layer 928. The dielectric layer 932 is positioned on the bottom of the solid metal plane 930. The third signal layer 934 is positioned on the bottom of the dielectric layer 932. Each layer or plane can be a ground plane or a power plane, and the selection of the type of layer or plane can be determined based, at least in part, on the product that the AI-EBG structure is incorporated into and the desired characteristics of the AI-EBG structure.

Figure 10:
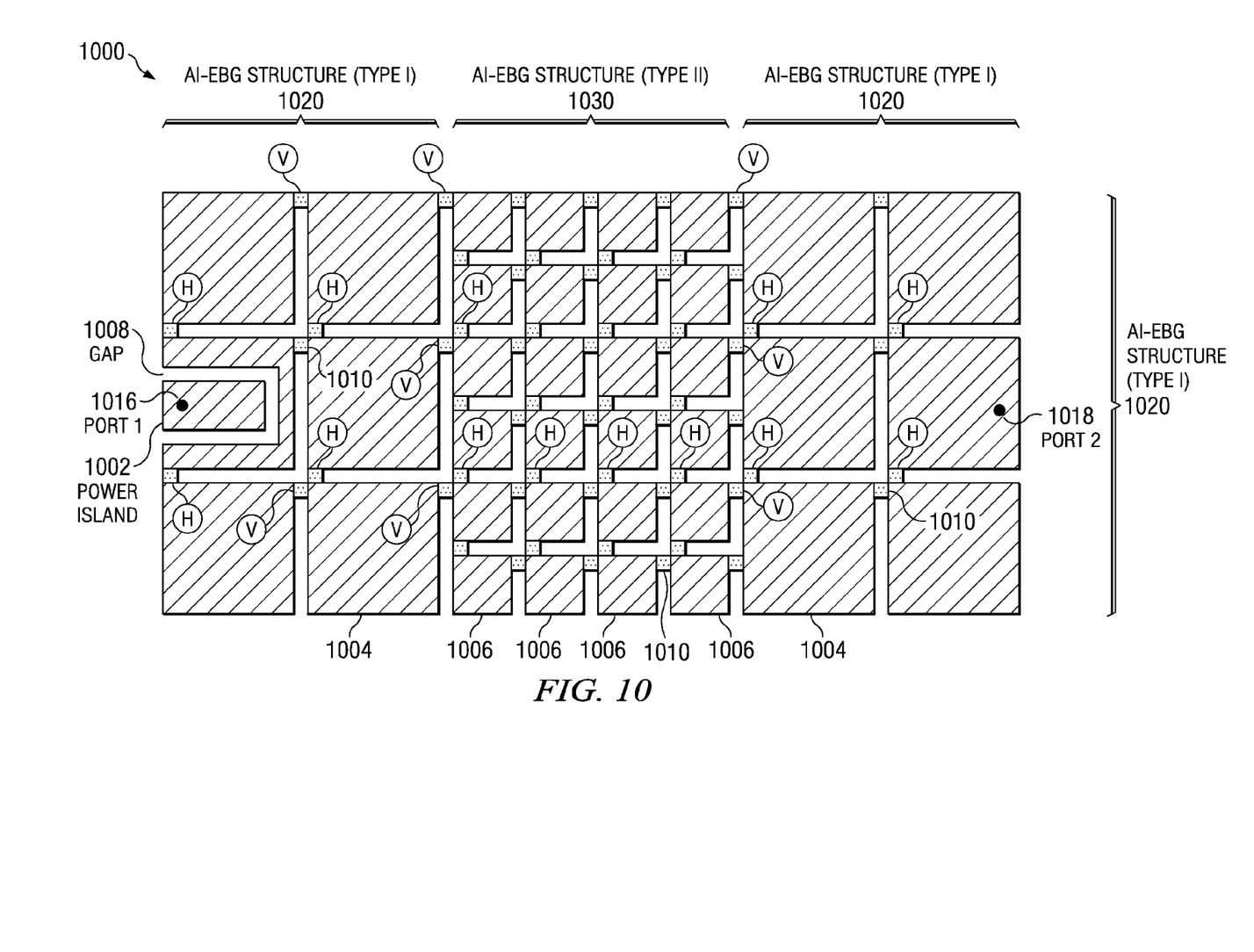
FIG. 10 illustrates a top view of an embodiment of a hybrid AI-EBG structure with a power island that provides ultimate noise isolation (from DC to far over 10 GHz)

In a preferred embodiment of the present invention, improved noise isolation for high-speed digital systems on packages and printed circuit boards (PCBs) is provided by the use of a power island and mixed (or hybrid) alternating impedance electromagnetic bandgap (AI-EBG) structures configured in combination to provide ultimate noise isolation (i.e., from DC to much greater than 10 GHz frequency). Turning now to FIG. 10, there is shown at 1000 a top view of an embodiment of a hybrid AI-EBG structure with a power island that provides ultimate noise isolation (i.e., from DC to well over 10 GHz) in accordance with a preferred embodiment, thereby advantageously providing ultimate noise isolation across a broad array of different frequencies from DC to much greater than 10 GHz. A power island 1002 is surrounded by a plurality of mixed AI-EBG structures of type I and type II to provide a power distribution network, where the AI-EBG structure of type I 1020 is formed from a plurality of elements 1004 and 1010 configured as previously described with respect to FIG. 4, and the AI-EBG structure of type II 1030 is formed from a plurality of elements 1006 and 1010 also configured as previously described with respect to FIG. 4, but where elements 1004 of the type I structure 1020 are substantially larger in both the width and length dimensions to those same dimensions for elements 1006 of the type II structure 1030 in order to provide the desired frequency response characteristics. In this structure 1000, the gap 1008 around the power island 1002 provides excellent isolation from DC to the first cavity resonant frequency. One AI-EBG structure (type I) 1020 comprising a plurality of elements 1004 and 1010 provides excellent isolation from the first cavity resonant frequency of around 1.5 GHz to about 5 GHz. Yet the other AI-EBG structure (type II) 1030 comprising a plurality of elements 1006 and 1010 provides excellent isolation from about 5 GHz to 10 GHz. Through use of this novel configuration with mixed AI-EBG structures 1020 and 1030 and a power island 1002, a combination effect of the hybrid AI-EBG structure 1000 (i.e., the unique combination of type I and type II structures) provides excellent isolation far in excess of 10 GHz.

Figure 11:
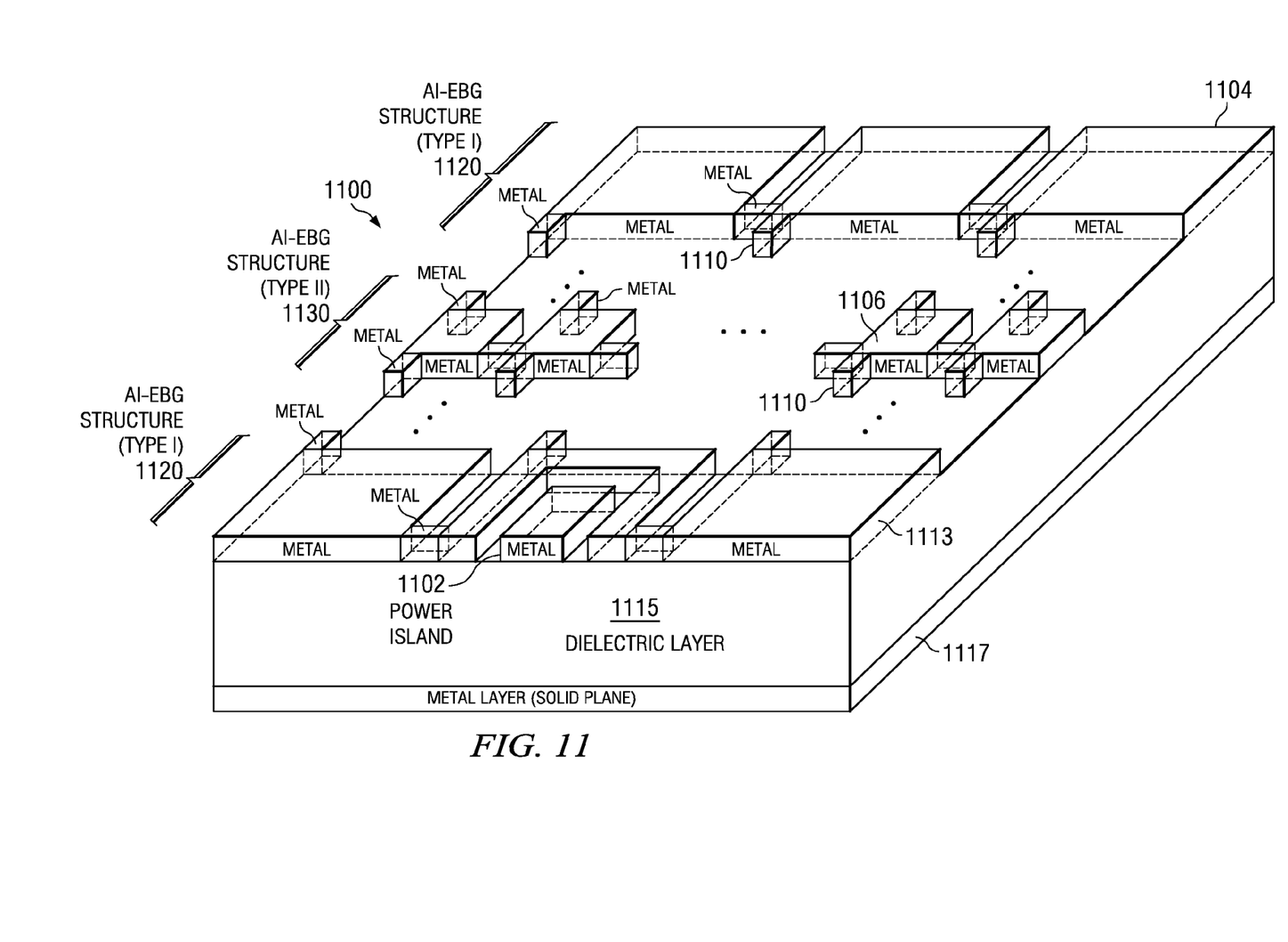
FIG. 11 illustrates a three-dimensional elevated, side view of the system in FIG. 10.

The AI-EBG structure 1000 is a metallic-dielectric EBG structure that comprises two metal layers separated by a thin dielectric material (similar to power/ground planes in packages and PCBs), similar to that as previously described with respect to FIG. 3. Ports 1016 and 1018 are similar to ports 116 and 118 previously described with respect to FIG. 1 (and are thus coupled to the power sources such as voltage or ground of other circuits needing excellent power supply noise isolation). In this configuration, Port 1 (element 1016) is surrounded by a power island 1002 to provide requisite noise isolation at the lower frequency range as previously described. As will be further shown in FIG. 11, for both the type I structure 1020 and the type II structure 1030 in this AI-EBG structure 1000, only one metal layer (FIG. 11, layer 1113) has a periodic pattern which is a two-dimensional (2-D) rectangular lattice with each element (excepting corner elements) including a metal patch with four connecting metal branches, such as previously described with respect to and depicted in, FIG. 4. The difference between the individual components of the type I structure and the type II structure are size differences, as can be seen in FIG. 10, in order to provide the desired frequency characteristics previously described. For the novel structure in FIG. 10, and in the preferred embodiment, the size of the element 1004 in the type I structure is 1.5 cm×1.5 cm and the size of the element 1006 in the type II structure is 0.7 cm×0.7 cm. The size of the element 1010 in FIG. 10 is 0.05 cm×0.1 cm in a horizontal direction (a few of such horizontal direction elements 1010 being indicated with an "H" in FIG. 10) and 0.1 cm×0.05 cm in a vertical direction (a few of such vertical direction elements 1010 being indicated with an "V" in FIG. 10), as also depicted in FIG. 11. It should be noted that the size of the elements 1010 in the type I and in the type II can be same or different depending on the particular application. The entire size of the novel structure in FIG. 10 is 9.5 cm×4.7 cm. It should be noted that the size of the novel structure can easily be smaller or larger depending on the particular application. This is an example to show the preferred sizes in the novel structure.

FIG. 11 illustrates a three-dimensional view of the system having AI-EBG structure 1100 which is the same structure as structure 1000 depicted in FIG. 10. This system having the AI-EBG structure 1100 includes an AI-EBG plane 1113, a dielectric layer 1115, and a solid metal plane 1117. The AI-EBG plane 1113 can be included in a ground plane or a power plane depending on a design purpose. For example, the AI-EBG plane 1113 can be a power plane etched with first elements 1112, second elements 1114 (as also shown in FIG. 1 as elements 112 and 114), third elements 1116 and fourth elements 1118 (as also shown in FIG. 1 as elements 112 and 114, but being of different relative size than elements 1112 and 1114, as previously described), while the solid metal plane 1117 can be a continuous (or solid) metal layer acting as a ground plane.

Figure 12:
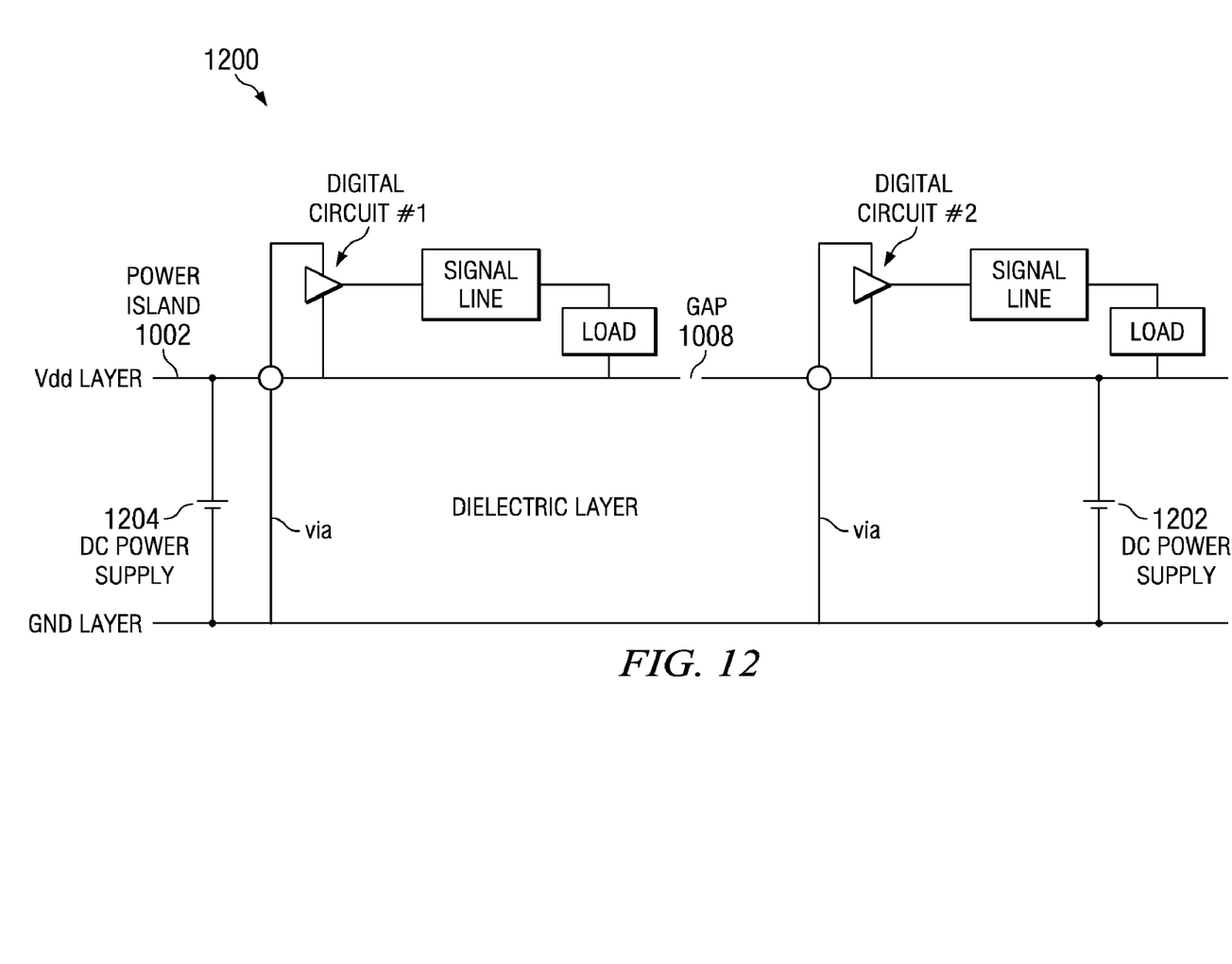
FIG. 12 illustrates a cross section of the power/ground planes, including the power island.

FIG. 12 illustrates at 1200 a cross-sectional of the power/ground planes, including the power island structure 1002 previously described with respect to FIG. 10. Primary power supply 1202 provides power for digital circuit #2. However, due to the gap around the power island (as also shown by gap 1008 in FIG. 10) and the associated DC/low-frequency isolation provided by such gap as previously described, a separate power source/supply 1204 is required to power digital circuit #1, since the DC voltage provided by power supply 1202 is blocked from Port 1 (element 1016 of FIG. 10) by such gap. Low frequency noise from this additional power supply 1204 is mitigated using traditional decoupling capacitors (not shown).

Figure 13:
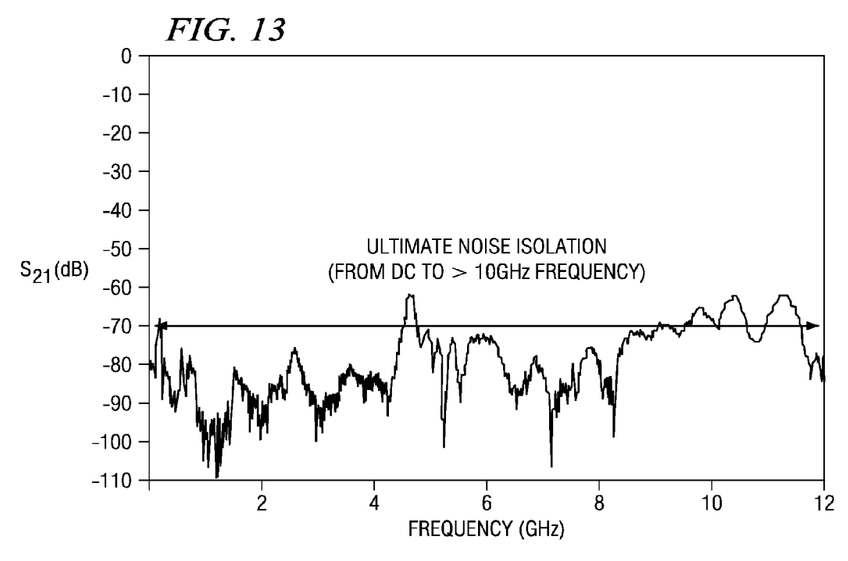
FIG. 13 illustrates corresponding transmission coefficient (S21) measurement results for the structure in FIG. 10.
Figure 14:
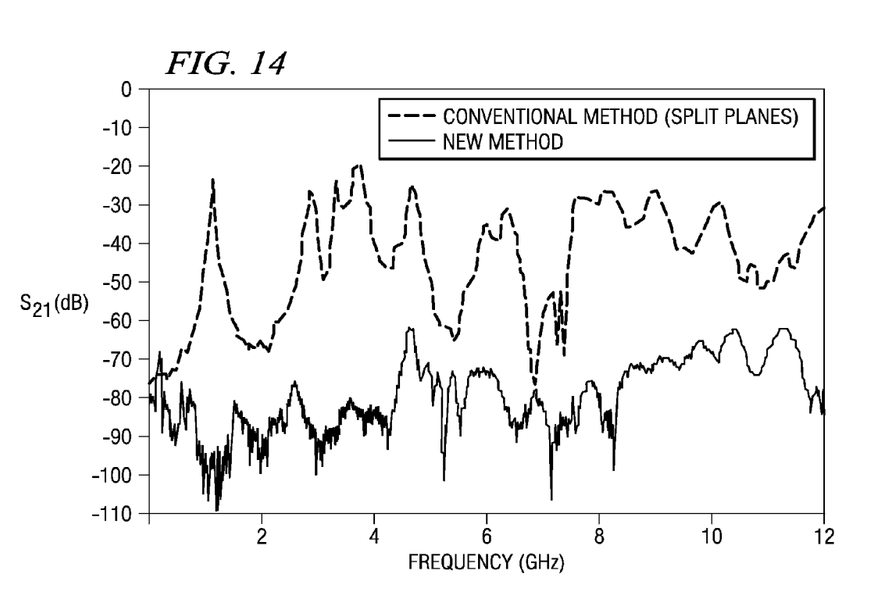
FIG. 14 illustrates a comparison of the S21 of the structure depicted in FIG. 10 and the S21 of a conventional split plane design.

To ensure that ultimate noise isolation is possible, this novel structure is fabricated using a standard FR4 process. FIG. 13 shows the frequency characteristics of the fabricated hybrid AI-EBG structure with a power island. The corresponding S21 measurement results for the structure in FIG. 10 are shown in FIG. 13. As can be observed, this structure shows excellent isolation from DC to 12 GHz (we measured only up to 12 GHz since the vector network analyzer (VNA) that was used worked properly up to 12 GHz). In fact, S21 reached the sensitivity limit (−80 dB~−110 dB) of the VNA. Some peaks around 5 GHz and 10 GHz can be suppressed more by optimizing the metal branches. FIG. 14 shows the comparison of the S21 of this novel structure depicted in FIG. 10 and the S21 of a conventional split plane design. As it can be seen, this novel structure provides much better isolation above 1.5 GHz than isolation by a conventional structure (i.e., split planes).

The description of the illustrative embodiments have been presented for purposes of illustration and description, and is not intended to be exhaustive or limited to the illustrative embodiments in the form disclosed. Many modifications and variations will be apparent to those of ordinary skill in the art. For example, depending on the particular application, multiple power islands could be provided, each one isolating the AI-EBG structure for a respective particular port or circuit that may have particularly unique noise isolation requirements. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A noise isolation system comprising a plurality of electromagnetic bandgap structures, comprising:

a power plane;

a dielectric layer disposed on the power plane;

an alternating impedance electromagnetic bandgap (AI-EBG) plane disposed on the dielectric layer, the AI-EBG plane comprising a first AI-EBG structure and a second AI-EBG structure; and a power island formed within and electrically isolated from at least one of a plurality of first alternating impedance electromagnetic bandgap patterns of the first AI-EBG structure by a gap that substantially surrounds the power island; wherein the plurality of first alternating impedance electromagnetic bandgap (AI-EBG) patterns of the first AI-EBG structure are disposed on the dielectric layer and the first AI-EBG patterns together with a portion of the power plane and a portion of the dielectric layer forms the first AI-EBG structure (type I), wherein each of the plurality of first alternating impedance bandgap structures comprises a metal patch having a first characteristic impedance and a plurality of branches connected to the metal patch and each of the branches has a second characteristic impedance, wherein the second characteristic impedance is relatively high with respect to the first characteristic impedance; and wherein a second plurality of second alternating impedance electromagnetic bandgap patterns (AI-EBG) are disposed on the dielectric layer and the second AI-EBG patterns together with a corresponding second portion of the power plane and a corresponding second portion of the dielectric layer forms the second AI-EBG structure (type II), wherein each of the plurality of second alternating impedance electromagnetic bandgap structures comprises a second metal patch having a third characteristic impedance and a plurality of second branches connected to the second metal patch with the second branches having a fourth characteristic impedance, wherein the fourth characteristic impedance is relatively high with respect to the third characteristic impedance.

2. The system of claim 1, wherein the gap around the power island provides noise isolation from DC to a first cavity resonant frequency of the noise isolation system, the type I AI-EBG structure provides noise isolation from the first cavity resonant frequency to an end bandgap frequency of the type I AI-EBG structure, and the type II AI-EBG structure provides noise isolation from the end bandgap frequency of the type I AI-EBG structure to at least 10 GHz.

3. The system of claim 2, wherein the end bandgap frequency of the type I AI-EBG structure is about 5 GHz and the first cavity resonant frequency is about 1.5 GHz.

* * * * *